(12) United States Patent
Chin et al.

(10) Patent No.: US 10,154,590 B2
(45) Date of Patent: Dec. 11, 2018

(54) CIRCUIT ASSEMBLY AND METHOD FOR MANUFACTURING SAME

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(72) Inventors: Tou Chin, Mie (JP); Yu Muronoi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/535,639

(22) PCT Filed: Dec. 8, 2015

(86) PCT No.: PCT/JP2015/084363
§ 371 (c)(1),
(2) Date: Jun. 13, 2017

(87) PCT Pub. No.: WO2016/104134
PCT Pub. Date: Jun. 30, 2016

(65) Prior Publication Data
US 2017/0354037 A1 Dec. 7, 2017

(30) Foreign Application Priority Data

Dec. 24, 2014 (JP) ................................. 2014-260102

(51) Int. Cl.
*H05K 1/18* (2006.01)
*H05K 1/02* (2006.01)
(Continued)

(52) U.S. Cl.
CPC ............ *H05K 1/181* (2013.01); *H05K 1/0203* (2013.01); *H05K 1/111* (2013.01); *H05K 3/325* (2013.01);
(Continued)

(58) Field of Classification Search
CPC ...................... H05K 1/11; H05K 1/111; H05K 1/181–1/182; H05K 3/025
(Continued)

(56) References Cited

U.S. PATENT DOCUMENTS 7,167,377 B2 * 1/2007 Onizuka .............. H05K 1/0263
361/772
8,284,563 B2 * 10/2012 Hosokawa .......... H05K 7/20854
361/775

FOREIGN PATENT DOCUMENTS

JP 2006005096 A 1/2006
JP 2006158062 A 6/2006
JP 2007027584 A 2/2007

OTHER PUBLICATIONS

Search Report for International Application No. PCT/JP2015/084363, dated Mar. 1, 2016, 2 pp.

* cited by examiner

*Primary Examiner* — Tuan T Dinh
(74) *Attorney, Agent, or Firm* — Honigman Miller Schwartz and Cohn LLP

(57) ABSTRACT

Provided are a circuit assembly in which it is possible to eliminate or reduce a level difference between a mounting surface of a substrate and portions to which terminals that are electrically connected to a conductive member are connected, and that can be easily produced, and a method for manufacturing the same. A circuit assembly includes a substrate provided with openings and an electronic component mounted on one side of the substrate, a conductive (Continued)

member that is a plate-shaped member fixed to another side of the substrate, the conductive member constituting a conductive path, and a relay member that is fixed to a surface on the substrate side of the conductive member and made of an electrically conductive material, the relay member being accommodated in the openings formed in the substrate, at least one terminal of the electronic component being connected to the relay member.

15 Claims, 8 Drawing Sheets

(51) Int. Cl.
*H05K 1/11* (2006.01)
*H05K 3/32* (2006.01)
*H05K 3/34* (2006.01)
*H05K 3/40* (2006.01)

(52) U.S. Cl.
CPC ......... *H05K 3/4046* (2013.01); *H05K 1/0263* (2013.01); *H05K 3/3421* (2013.01); *H05K 3/4015* (2013.01); *H05K 2201/066* (2013.01); *H05K 2201/068* (2013.01); *H05K 2201/09063* (2013.01); *H05K 2201/1031* (2013.01); *H05K 2201/10166* (2013.01); *H05K 2201/10628* (2013.01); *H05K 2201/10757* (2013.01); *Y02P 70/611* (2015.11); *Y02P 70/613* (2015.11)

(58) Field of Classification Search
USPC ............... 361/760–763, 772–777, 803, 813; 439/76.1–76.2
See application file for complete search history.

CIRCUIT ASSEMBLY AND METHOD FOR MANUFACTURING SAME

CROSS-REFERENCE TO RELATED APPLICATIONS

This application is the U.S. national stage of PCT/JP2015/084363 filed Dec. 8, 2015, which claims priority of Japanese Patent Application No. JP 2014-260102 filed Dec. 24, 2014.

TECHNICAL FIELD

The present invention relates to a circuit assembly including a substrate and a conductive member, and a method for manufacturing the same.

BACKGROUND

Circuit assemblies are known in which a conductive member that is part of a circuit that allows a relatively large electric current to flow is fixed to a substrate on which a conductive pattern is formed that is part of a circuit that allows a relatively small electric current to flow (for example, see JP 2006-5096A below).

In the circuit assembly described in JP 2006-5096A above, the conductive member is provided with a protruding portion accommodated in an opening formed in the substrate, and a portion of a terminal of an electronic component is connected to the protruding portion. A level difference between a front end surface (a surface to which the terminal is connected) of the protruding portion and a surface (a mounting surface) of the substrate can be made small (flat) by forming such a protruding portion, and thus the electronic component can be mounted easily.

However, as described in JP 2006-5096A above, in a configuration in which a plurality of protruding portions are formed by bending a conductive member, if it is necessary to form two or more protruding portions at relatively close positions, it is difficult to form the protruding portions.

An object of the present invention is to provide a circuit assembly that can be produced easily and in which it is possible to eliminate or reduce a level difference between a portion to which a terminal that is electrically connected to a conductive member is connected and a mounting surface of the substrate, and a method for manufacturing the same.

SUMMARY

In order to resolve the above-described issue, a circuit assembly according to the present invention includes a substrate provided with an opening and an electronic component mounted on one side of the substrate, a conductive member that is a plate-shaped member fixed to another side of the substrate, the conductive member constituting a conductive path, and a relay member that is fixed to a surface on the substrate side of the conductive member and made of an electrically conductive material, the relay member being accommodated in the opening formed in the substrate, at least one terminal of the electronic component being connected to the relay member.

The surface of the relay member that is opposite to the conductive member and the surface of the substrate on which the electronic component is mounted may have approximately the same height.

The relay member may be made of a material different from that of the conductive member. Specifically, a difference between linear expansion coefficients of a material constituting the substrate and a material constituting the relay member may be smaller than 10 ppm/° C.

In order to resolve the above-described issue, a method for manufacturing the circuit assembly according to the present invention includes a relay member fixing step of fixing a plurality of the relay members to the conductive member simultaneously, in which a pressure applying means for pressing the plurality of relay members against the conductive member is used in the relay member fixing step.

The pressure applying means may have a plurality of pressing members that respectively come into contact with the plurality of relay members.

The pressing members may be each provided with a recessed portion whose opening portion is larger than the corresponding relay member and that has a tapered surface whose inner surface widens toward its front end, and the relay members may be pressed against the conductive member by the tapered surfaces of the pressing members in the relay member fixing step.

If the conductive member includes a cantilever-shaped portion and the relay members are fixed to the cantilever-shaped portion, a support means for supporting the cantilever-shaped portion is used in the relay member fixing step.

If a portion of the conductive member has a cantilever shape due to formation of a slit in the conductive member, the support means has a support member provided with a tapered portion that tapers off toward its front end, and the tapered portion of the support member enters the slit of the conductive member in the relay member fixing step.

A circuit assembly according to the present invention has a configuration in which a relay member for electrically connecting at least one terminal of an electronic component to a conductive member is fixed to the conductive member, and thus it is possible to reduce a level difference between a mounting surface of the substrate and portions of the relay member to which the terminals that are electrically connected to the conductive member are connected. Also, since the circuit assembly has the configuration in which the relay member that is formed separately from the conductive member is fixed to the conductive member, it is not problematic in manufacturing as with a conventional configuration, and can be produced easily.

When the surface of the relay member opposite to the conductive member and the mounting surface of the substrate have approximately the same height, a portion to which at least one of the terminals of the electronic component is connected and portions to which the other terminals of the electronic component are connected are approximately flat (flush with each other), and thus the electronic component can be mounted easily. Also, it is possible to reduce the burden imposed on the electronic component or the terminals.

There is a risk that in a usage environment with a large temperature change, a difference between linear expansion rates of the relay member and the substrate causes a level difference (increases a level difference) between the portion to which at least one of the terminals of the electronic component is connected and the portions to which the other terminals are connected. Such a level difference (a change in size of the level difference) will increase the load applied to the electronic component or the load applied to the portions connected to the terminals (soldered portions or the like). Since the relay member is formed separately from the conductive member in the present invention, it is possible to select a material having a very small difference between linear expansion rates of the relay member and the substrate.

According to the method for manufacturing the circuit assembly according to the present invention, when the plurality of relay members are fixed to the conductive member, usage of the pressure applying means for pressing the plurality of relay members against the conductive member makes it possible to avoid a situation in which some relay members are not sufficiently pressed against the conductive member. Therefore, it is possible to prevent a situation in which some relay members and the conductive member are not sufficiently joined or positions (heights) of the front end surfaces of the relay members are not the same.

If the conductive member includes a cantilever-shaped portion and the relay members are fixed to the cantilever-shaped portion, there is a risk that the cantilever-shaped portion will shift and the positions to which the relay members are fixed will shift. To address this problem, usage of a support means for supporting the cantilever-shaped portion makes it possible to prevent shifting of the positions to which the relay members are fixed.

BRIEF DESCRIPTION OF DRAWINGS

FIG. 2 shows a cross-sectional view of a portion (a substrate and a conductive member) of the region of the circuit assembly on which the electronic component is mounted.

DETAILED DESCRIPTION OF PREFERRED EMBODIMENTS

Hereinafter, an embodiment of the present invention will be described in detail with reference to the drawings. Unless indicated otherwise, "surface direction" in the description below refers to a surface direction (i.e. direction along the surface) of a substrate 10 or a conductive member 20, and "height direction" (vertical direction) refers to a direction orthogonal to the surface direction (where a surface of the substrate 10 on which electronic components 30 are mounted is regarded as the top surface). Note that these directions do not limit a direction in which a circuit assembly 1 is installed.

Figure 1:
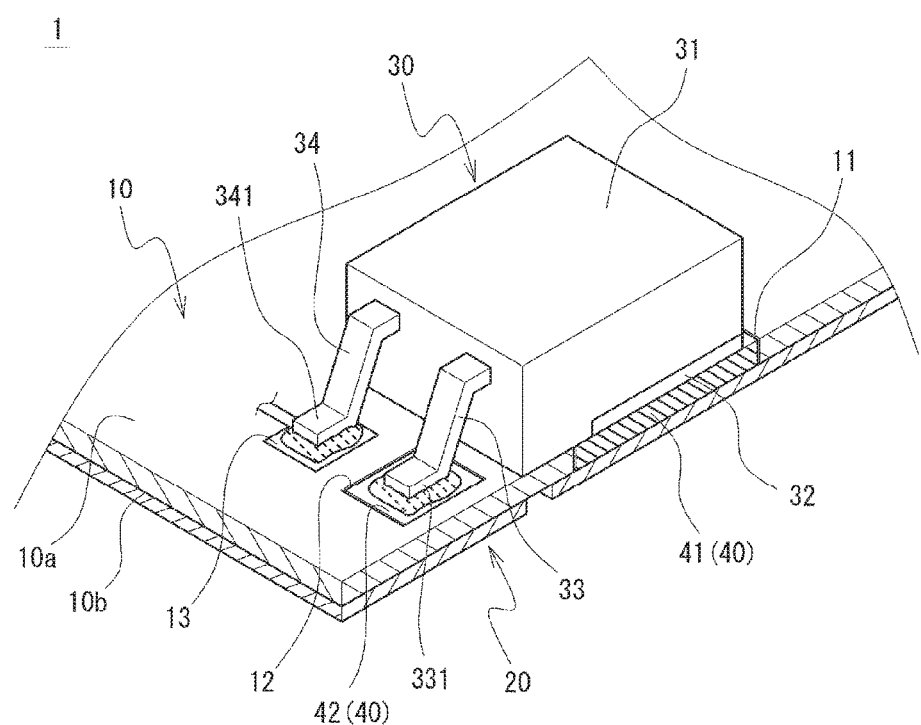
FIG. 1 is a diagram of an external appearance of a circuit assembly according to one embodiment of the present invention, showing an enlarged region on which an electronic component is mounted.
Figure 2A:
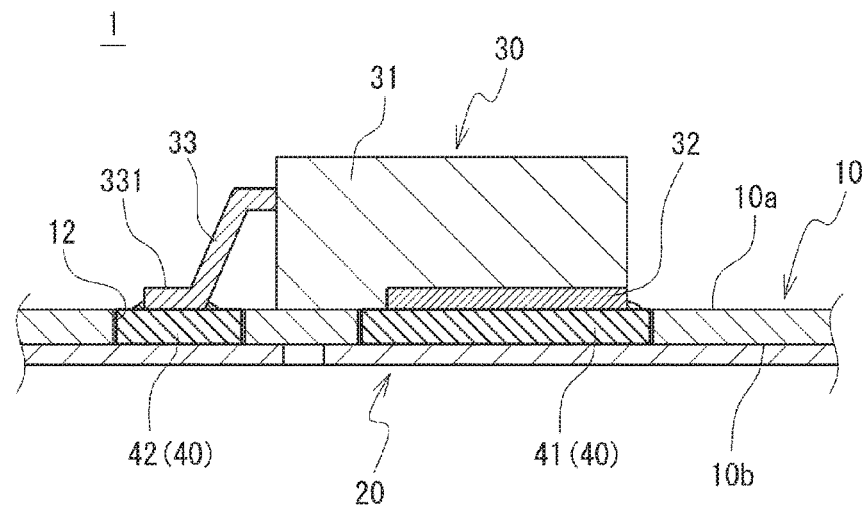
FIG. 2(a) is a diagram of the region cut along a plane passing through front end portions of a first terminal and a second terminal.
Figure 2B:
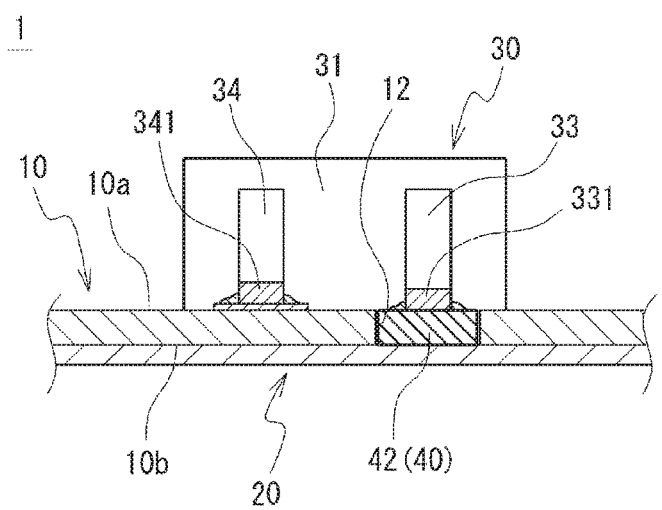
FIG. 2(b) shows a cross-sectional view of the region cut along a plane passing through a front end portion of the second terminal and a front end portion of a third terminal.

The circuit assembly 1 according to one embodiment of the present invention shown in FIGS. 1 and 2 includes the substrate 10, the conductive member 20, and relay members 40. The substrate 10 is such that a conductive pattern (only a land 13, which is a portion of the conductive pattern and will be described later, is depicted) is formed on one side 10a (an upper surface side). A conductive path constituted by the conductive pattern is a conductive path (portion of the circuit) for control signals, through which an electric current flows that is smaller than the electric current through the conductive path (portion of the circuit) constituted by the conductive member 20.

The conductive member 20 is a plate-shaped portion fixed to the other side 10b of the substrate 10. The conductive member 20 is formed into a predetermined shape by stamping or the like, and constitutes a conductive path for power, which is a portion through which a relatively large (larger than in the conductive path constituted by the conductive pattern) electric current flows. Note that description and illustration of a specific configuration of the conductive path are omitted. The conductive member 20 is also referred to as "bus bar" (bus bar plate) or the like. The conductive member 20 is fixed to the other side 10b of the substrate 10 via an insulating adhesive or adhesive sheet, for example. Accordingly, the substrate 10 and the conductive member 20 are integrated into a single member. Note that a heat dissipation member may be fixed to the lower side (the side opposite to the substrate 10) of the conductive member 20. If the heat dissipation member is made of an electrically conductive material, the conductive member 20 and the heat dissipation member are insulated from each other. A configuration may be adopted in which at least a portion of the conductive member 20 is exposed to the outside without providing the heat dissipation member and the conductive member 20 itself exhibits a heat dissipation function.

The electronic components 30 are mounted on the substrate 10, and each has a main element body 31 and a terminal portion. The electronic components 30 of the present embodiment each have a first terminal 32, a second terminal 33, and a third terminal 34 serving as terminal portions. An example of such an electronic component 30 is a transistor (FET). In this case, the first terminal 32 is a drain terminal, the second terminal 33 is a source terminal, and the third terminal 34 is a gate terminal. As described later, the first terminal 32 is connected to the conductive member 20, the second terminal 33 is connected to a site other than the site of the conductive member 20 to which the first terminal 32 is connected, and the third terminal 34 is connected to the conductive pattern of the substrate 10. In the following explanations, it is assumed that the electronic component 30 has all different types of terminals, but it may also have a plurality of identical terminals. An element other than the electronic components 30 may be mounted on the substrate 10.

The second terminal 33 and the third terminal 34 protrude from a side surface of the main body 31, which has an approximately rectangular parallelepiped shape. Specifically, both these terminals have base end portions protruding along the surface direction, portions that bend downward from the front ends of the base end portions, and front end portions 331 and 341 extending from the front ends of the bent portions along the surface direction. The heights of the front end portions 331 and 341 (positions in the vertical direction) that are soldered are approximately the same. In the present embodiment, the second terminal 33 and the third terminal 34 have identical shapes. That is, when viewed in the direction along the surface of the main body 31 that is provided with the terminals, the second terminal 33 and the third terminal 34 overlap with each other.

The first terminal 32 is a plate-shaped portion provided at the bottom (a lower surface) of the main body 31. That is, the first terminal 32 extends in the surface direction. The first terminal 32 can also be regarded as a portion constituting at least a part of the bottom of the main body 31. The bottom surface of the main body 31, that is, the lower surface of the first terminal 32 and the lower surfaces of the front end portions 331 and 341 of the second terminal 33 and the third terminal 34 have the same height (flush with each other).

The relay members 40 are made of an electrically conductive material and fixed to the upper surface of the conductive member 20 (the surface on the substrate 10 side). In the present embodiment, a plurality of relay members 40 are fixed to the conductive member 20. Specifically, one electronic component 30 (the electronic component 30 to be electrically connected to the conductive member 20) mounted on the substrate 10 is provided with two relay members 40. That is, the number of electronic components 30×two relay members 40 are fixed to the substrate 10. Hereinafter, the relay member 40 connected to the first terminal 32 may be denoted as a first relay member 41 and the relay member 40 connected to the second terminal 33 may be denoted as a second relay member 42, to distinguish these relay members 40. The heights of the relay members 40 (lengths in the vertical direction) are set to be approximately the same as the thickness of the substrate 10 (the length in the vertical direction).

A first opening 11 and a second opening 12 that pass through the substrate 10 in its thickness direction are formed at locations of the substrate 10 on which the electronic component 30 is mounted. The first opening 11 has such a size that the first relay member 41 can enter the first opening 11. The second opening 12 has such a size that the second relay member 42 can enter the second opening 12. The first relay member 41 is accommodated in the first opening 11 and the second relay member 42 is accommodated in the second opening 12 by fixing to the substrate 10 the conductive member 20 to which the relay members 40 are fixed. Since the heights of the relay members 40 are set to be approximately the same as the thickness of the substrate 10, by combining the substrate 10, the conductive member 20, and the relay members 40 with the conductive member 20 with the relay members 40 fixed to it being fixed to the substrate 10, the upper surfaces of the relay members 40 and the one side 10a (mounting surface) of the substrate 10 have approximately the same height (are flush with each other). Note that if the thickness of an adhesive layer for fixing the conductive member 20 to the substrate 10 cannot be ignored, the heights of the relay members 40 are set such that the upper surfaces of the relay members 40 and the one side 10a of the substrate 10 have approximately the same height, with the thickness of the adhesive layer being taken into consideration.

The electronic components 30 are mounted on the substrate 10 (assembly of the substrate 10, the conductive member 20, and the relay members 40) as follows. Note that the electronic components 30 may be mounted automatically (by flow soldering or reflow soldering) or manually. The first terminal 32 of the electronic component 30 is connected (soldered, for example) to the first relay member 41 that has been fitted into the first opening 11. Since the upper surface of the first relay member 41 and the one side 10a of the substrate 10 have approximately the same height, the first terminal 32 is connected to the first relay member 41 in a state in which the main body 31 of the electronic component 30 is placed across the first relay member 41 and the substrate 10. Accordingly, the first terminal 32 is electrically connected to a predetermined portion of the conductive member 20 via the first relay member 41. Note that in order to ensure the strength of physical connection between the electronic component 30 and the substrate 10, the main body 31 of the electronic component 30 may be joined to the substrate 10 as long as the first terminal 32 is not electrically connected to the conductive pattern formed on the substrate 10.

The second terminal 33 of the electronic component 30 is connected (soldered, for example) to the second relay member 42 that has been fitted into the second opening 12. Since the upper surface of the second relay member 42 and the one side 10a of the substrate 10 have approximately the same height and the bottom surface of the main body 31 and the lower surface of the front end portion 331 of the second terminal 33 have approximately the same height, the front end portion 331 of the second terminal 33 is in contact with the upper surface of the second relay member 42 or face each other with a slight gap in the state in which a portion of the main body 31 is placed on the substrate 10 and the first relay member 41. In this state, the front end portion 331 of the second terminal 33 and the upper surface of the second relay member 42 are connected to each other. Accordingly, the second terminal 33 is electrically connected to a predetermined portion of the conductive member 20 via the second relay member 42. Note that the portion of the conductive member 20 to which the first terminal 32 is electrically connected and the portion to which the second terminal 33 is electrically connected are electrically insulated from each other.

The front end portion 341 of the third terminal 34 of the electronic component 30 is located on a predetermined site of the conductive pattern in a state in which the electronic component 30 is placed at a predetermined position of the substrate 10. Specifically, the third terminal 34 is located on the land 13 (a portion of the conductive pattern) to which the third terminal 34 is to be connected. The third terminal 34 is soldered to this land 13. That is, the third terminal 34 is physically and electrically connected to the conductive pattern formed on the substrate 10.

Since the above-described circuit assembly 1 according to the present embodiment has a configuration in which the relay members 40 for electrically connecting at least one of the terminals of the electronic components 30 to the conductive member 20 are fixed to the conductive member 20, it is possible to eliminate a level difference between the one side 10a (mounting surface) of the substrate 10 and the portions of the relay members 40 to which the terminals that are electrically connected to the conductive member 20 are connected.

Figure 3:
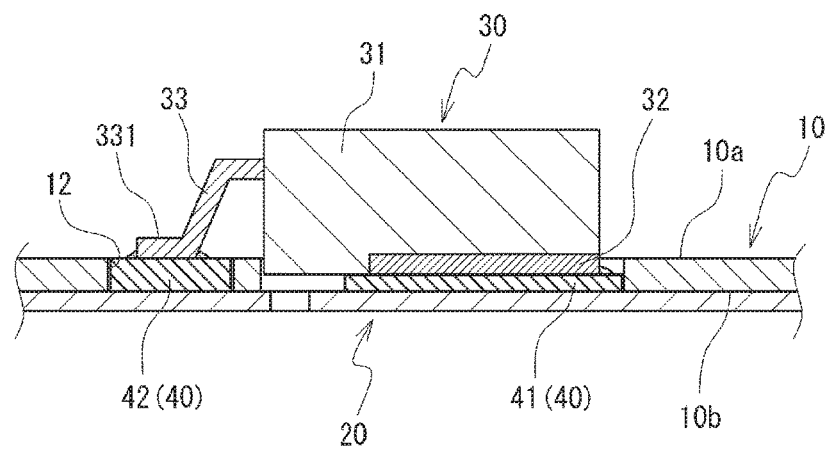
FIG. 3 is a diagram illustrating a variation of the circuit assembly according to this embodiment.

However, as shown in FIG. 3, for example, if a electronic component 30 is used in which the lower surface of the first terminal 32 and the lower surfaces of the second terminal 33 and the third terminal 34 have different heights, then this electronic component may be easier to mount if the one side 10a of the substrate 10 and the upper surfaces of at least some relay members 40 (the first relay member 41 in the configuration shown in FIG. 3) have different heights. In such a case, it is sufficient that the heights of the relay members 40 are set such that a level difference with a predetermine size arises between the one side 10a (mounting surface) of the substrate 10 and the portions of the relay member 40 to which the terminals that are electrically connected to the conductive member 20 are connected. That is, it can be said that the relay members 40 are matched to the shapes of the electronic components 30 in order to compensate a difference between heights of the one side 10a of the substrate 10 and the upper surface of the conductive member 20. Accordingly, the electronic components 30 can be easily mounted and it is possible to reduce the load applied to the electronic components 30 after the electronic components 30 are mounted.

Also, compared to structures in which the conductive member 20 is provided with a protrusion accommodated in an opening formed in the substrate 10, the circuit assembly 1 is easily produced due to a configuration in which the relay members 40 formed separately from the conductive member 20 are fixed to the conductive member 20. That is, if, as in the present embodiment, the first terminal 32 and the second terminal 33 need to be electrically connected to the conductive member 20, a protrusion for connection to the first terminal 32 and a protrusion for connection to second terminal 33 would need to be formed in the conductive member 20. That is, two protrusions would need to be formed at close positions, and it is difficult to produce such a circuit assembly. For example, a problem will arise that protrusions cannot be formed well because one protrusion pulls the other protrusion or portions of the conductive member 20 in which a plurality of protrusions are closely provided break when the protrusions are formed. In contrast, even if the relay members 40 are located close to each other, the circuit assembly 1 according to the present embodiment can be produced with little difficulty because the relay members 40 are formed separately from the conductive member 20.

Also, in the circuit assembly 1 according to the present embodiment, the material constituting the conductive member 20 and the material constituting the relay members 40 are different from each other. It is desirable to select, as the material constituting the relay members 40, a material having a linear expansion rate (the rate of change in length per unit length caused by temperature change (per unit temperature); in this specification, this rate (changed length/unit length) is expressed by ppm/° C.) that is as close as possible to that of the material constituting the substrate 10.

A method for selecting a specific material is as follows. In practice, it is possible to avoid a situation in which the material (solder or the like) for joining the electronic components 30 and the relay members 40 or the main bodies of the electronic components 30 do not function due to stress, as long as the strain (which may be suitably measured with a strain gauge) occurring in portions at which (terminals of) the electronic components 30 and the relay members 40 are joined is not more than 1000 μst (microstrain: $10^{-6}$ strain).

Therefore, if a temperature change is assumed to be 100° C. (a temperature change of a vehicle on which the circuit assembly 1 is mounted is assumed to be 100° C. and the circuit assembly 1 is designed to withstand this temperature change of 100° C.), the occurring strain can be made not more than 1000 μst by making the difference between the linear expansion coefficients of the material constituting the substrate 10 and the material constituting the relay members 40 smaller than 10 ppm/° C. For example, if the linear expansion coefficient of the material constituting the substrate 10 is 30 ppm/° C., the linear expansion coefficient of the material constituting the relay members 40 is set in a range of 20 to 40 ppm/° C. If the linear expansion coefficient of the material constituting the substrate 10 is 10 ppm/° C., the linear expansion coefficient of the material constituting the relay members 40 is set in a range of 0 to 20 ppm/° C.

Examples of the material constituting the substrate 10 include a glass epoxy (FR4) and ceramics ($Al_2O_3$, AlN, and the like). When the material constituting the substrate 10 is a glass epoxy having a linear expansion coefficient of 30 ppm/° C. and the material constituting the relay members 40 is brass having a linear expansion coefficient of 23 ppm/° C., the maximum strain can be reduced to about 700 μst. That is, if the material constituting the substrate 10 is a glass epoxy (with a linear expansion coefficient of about 30 ppm/° C.), it is sufficient that the linear expansion coefficient of the material constituting the relay members 40 is set to 20 to 40 ppm/° C. On the other hand, when the material constituting the substrate 10 is a ceramic having a linear expansion coefficient of 7 ppm/° C. and the material for the relay members 40 is a copper-iron alloy having a linear expansion coefficient of 14 ppm/° C., the maximum strain can be reduced to about 700 μst. That is, if the material constituting the substrate 10 is a ceramic (with a linear expansion coefficient of about 7 to 10 ppm/° C.), it is sufficient that the linear expansion coefficient of the material constituting the relay members 40 is set to not more than 20 ppm/° C.

The temperature change is assumed to be 100° C. above, and this assumption is based on a temperature change inside the car. In this case, if the reference temperature is 30±30° C., −70±30 to 130±30° C., that is, the minimum temperature range is −40 to 100° C., and the circuit assembly can handle the temperature environment inside the car, but it does not satisfy the temperature environment when the circuit assembly is installed in an engine room or the like. If the temperature change is assumed to be 150° C., and similarly to the case where the temperature change is 100° C., the minimum temperature range is estimated with a reference temperature of 30±30° C., then the minimum temperature range is −90 to 150° C., sufficiently satisfying the temperature environment when the circuit assembly is installed in an engine room or the like. In this manner, if the temperature change in the case where the circuit assembly is installed in an engine room is assumed to be 150° C., the occurring strain can be made not more than 1000 μst by making the difference between the linear expansion coefficients of the material constituting the substrate 10 and the material constituting the relay members 40 smaller than 6 ppm/° C.

In order to obtain a circuit assembly 1 that has excellent durability to temperature change, it is necessary to prevent a level difference (or prevent the level difference from becoming large in designs where a level difference is set in advance) between the upper surfaces of the relay members 40 to which some of the terminals (namely the first terminal 32 and the second terminal 33 in the present embodiment) of the electronic component 30 are connected and the one side 10a (mounting surface) of the substrate 10 to which the other terminals (the third terminal 34 in the present embodiment) are connected. Such a level difference (a change in size of the level difference) will increase the load applied to the electronic components 30 and the load applied to the portions connected to the terminals (soldered portions or the like). In the present embodiment, a material having a very small difference to the linear expansion rate of the substrate 10 can be selected as the material for the relay members 40. That is, since the conductive member 20 constitutes a main conductive path of the circuit assembly 1, and needs to have various material properties such as physical strength, a material having a linear expansion rate close to that of the substrate 10 cannot be selected as the material constituting the conductive member 20, in some cases. However, in the present embodiment, the relay members 40 are formed separately from the conductive member 20, and thus a material having a very small difference to the linear expansion rate of the substrate 10 can be selected easily.

Hereinafter, a method for manufacturing the above-described circuit assembly 1 (method for manufacturing a circuit assembly according to one embodiment of the present invention) will be described. The method for manufacturing the circuit assembly 1 according to the present embodiment includes a step of fixing the relay members 40 to the conductive member 20 (hereinafter referred to as "relay member fixing step"). The suitable order for manufacturing the circuit assembly is a step of forming the conductive member 20, the relay member fixing step, a step of joining the substrate 10 and the conductive member 20 to which the relay members 40 are fixed, a step of cutting an excessive portion of the conductive member 20, and a step of mounting the electronic components 30 or the like. Hereinafter, the relay member fixing step included in the manufacturing method according to the present embodiment will be described in detail. The other steps, that is, the step of joining the substrate 10 and the conductive member 20 to which the relay members 40 are fixed, the step of mounting the electronic components 30 etc., and the like may have any aspects (the above-described aspect, for example), and thus their description is omitted.

The relay member fixing step is a step of fixing a plurality of relay members 40 to the conductive member 20 simultaneously. The upper surfaces of the relay members 40 are portions to which terminals of the electronic components 30 are connected, and thus the precision in the positions of the upper surfaces in the height (vertical) direction is important. For example, if the heights of the upper surfaces of all of the relay members 40 are the same, as in the configuration shown in FIGS. 1 and 2, it is necessary to join the conductive member 20 and the plurality of relay members 40 provided with the same height while the relay members 40 are pressed against the conductive member 20 with the same force. In the relay member fixing step in the manufacturing method according to the present embodiment, a pressure applying means 50 is used for pressing the plurality of relay members 40 against the conductive member 20.

Figure 4:
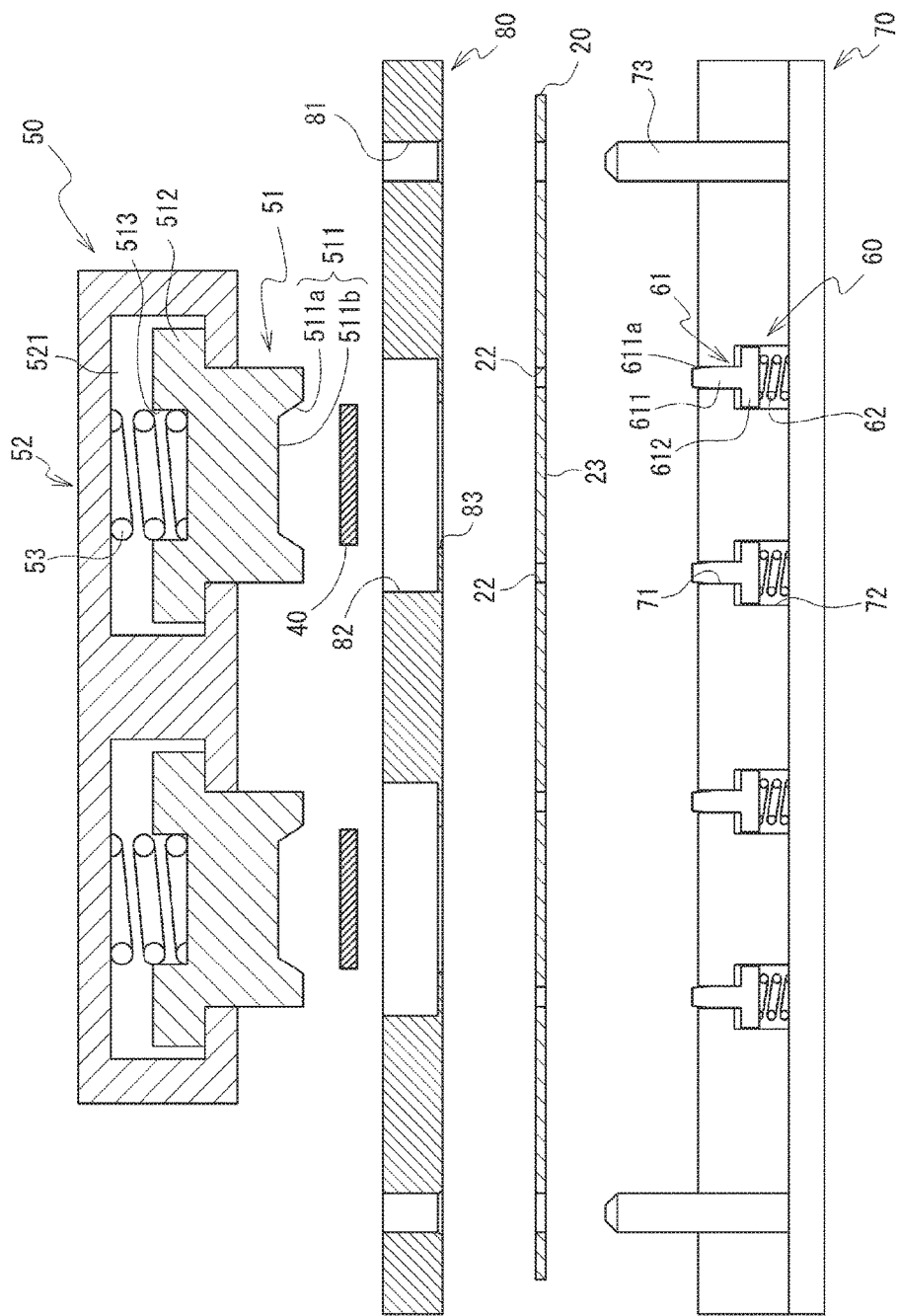
FIG. 4 is a diagram illustrating a pressure applying means and a support means that are used in a preferable method for manufacturing the circuit assembly according to this embodiment, showing the state before relay members are pressed against a conductive member.
Figure 5:
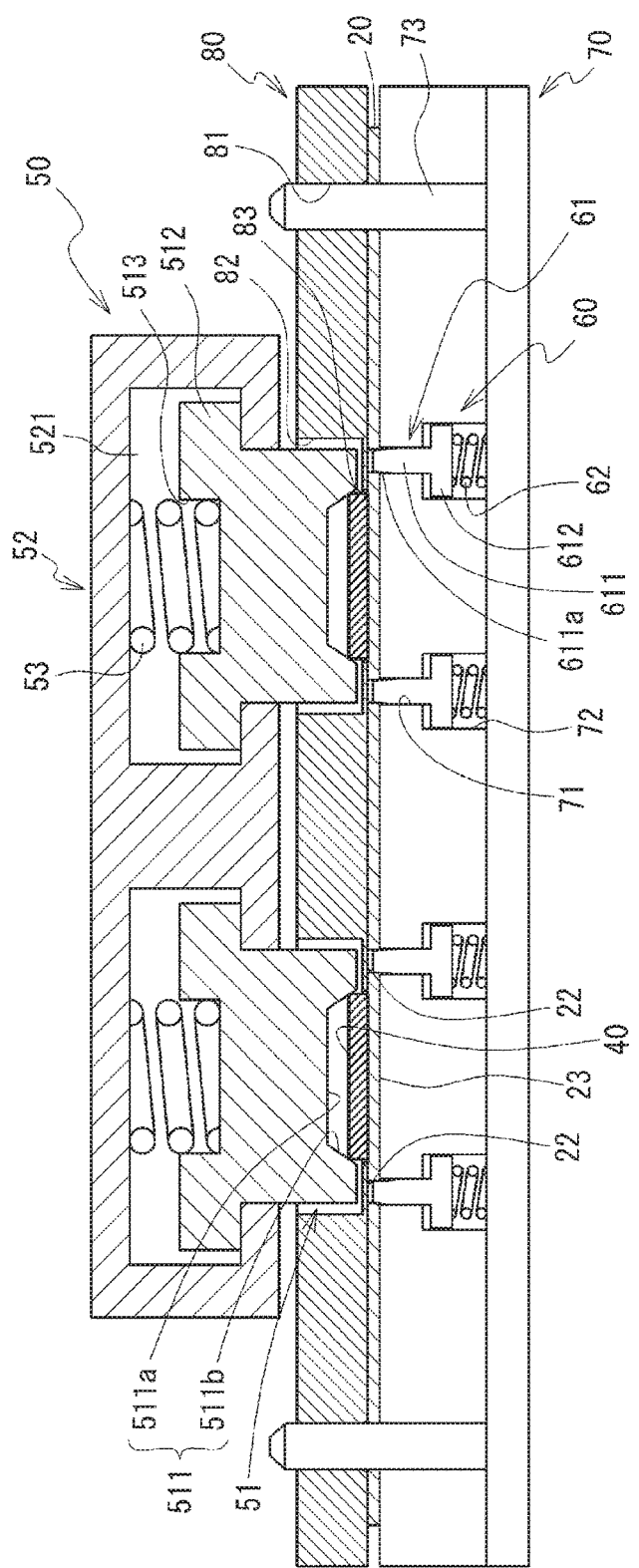
FIG. 5 is a diagram illustrating the pressure applying means and the support means that are used in a preferable method for manufacturing the circuit assembly according to this embodiment, showing the state in which relay members are pressed against the conductive member.

A specific example of this pressure applying means 50 is shown in FIGS. 4 and 5. The pressure applying means 50 has pressing members 51. Specifically, the pressure applying means 50 has the same number of pressing members 51 (correspond to the respective relay members 40) as there are relay members 40 that are to be fixed to the conductive member 20. As described later, when the relay members 40 are fixed to the conductive member 20, one pressing member 51 presses one relay member 50 against the conductive member 20.

The front end of the pressing member 51 is provided with a recessed portion 511. The inner surface of the recessed portion 511 is a tapered surface 511a that widens toward its front end. The opening of the recessed portion 511 is larger than the relay member 40. Therefore, at least a part of the relay member 40 can enter the recessed portion 511. Also, a bottom surface 511b of the recessed portion 511 is smaller than the relay member 40. Therefore, when the relay member 40 enters the recessed portion 511, the relay member 40 comes into contact with the tapered surface 511a.

The pressing member 51 has a hook portion 512 that is thicker than the front end, on the side opposite to the recessed portion 511. This hook portion 512 is accommodated in a space 521 formed in a holder 52. The opening of this space 521 is set to have such a shape that portions other than the hook portion 512 of the pressing member 51 can pass through the opening, but the hook portion 512 cannot. Also, the size of the space 521 in the vertical direction is larger than the size of the hook portion 512 in the vertical direction. Therefore, the pressing member 51 can move in the vertical direction within this difference.

Also, biasing members 53 for pressing (coil springs in the present embodiment) are disposed between the end surface (base surface) of each pressing member 51 that is provided with the hook portion 512 and the upper surface of the holder 52 that faces the space 521. Accordingly, when the pressing member 51 moves upward, the biasing force of the biasing member 53 for pressing is applied to this pressing member 51. Note that in the present embodiment, the base surface of the pressing member 51 is provided with a pit 513 that is recessed toward the front end, and the end portion of the biasing member 53 for pressing is accommodated in this pit 513. The plurality of pressing members 51 can independently move in the vertical direction (without being influenced by the other pressing members 51), and when the pressing members 51 move upward, the biasing force of the biasing members 53 for pressing is applied thereto.

Also, a support means 60 is used in the relay member fixing step in the manufacturing method according to the present embodiment. The support means 60 supports a cantilever-shaped portion 23 of the conductive member 20. The support means 60 shown in FIGS. 4 and 5 has a support member 61 supported by a base member 70. The support member 61 has a shaft-shaped portion 611 on its front end (upper side) and a flange portion 612 on its base end (lower side). The front end of the shaft-shaped portion 611 is provided with a tapered portion 611a that tapers off toward its end. The base member 70 is provided with a hole having a relatively smaller diameter (hereinafter referred to as "smaller hole 71") and a hole having a relatively larger diameter (hereinafter referred to as "larger hole 72") such that their central axis lines coincide with each other and communicate with each other in the vertical direction. The shaft-shaped portion 611 of the support member 61 is accommodated in the smaller hole 71, the flange portion 612 of the support member 61 is accommodated in the larger hole 72, and the support member 61 is slidable in the vertical direction.

Figure 6:
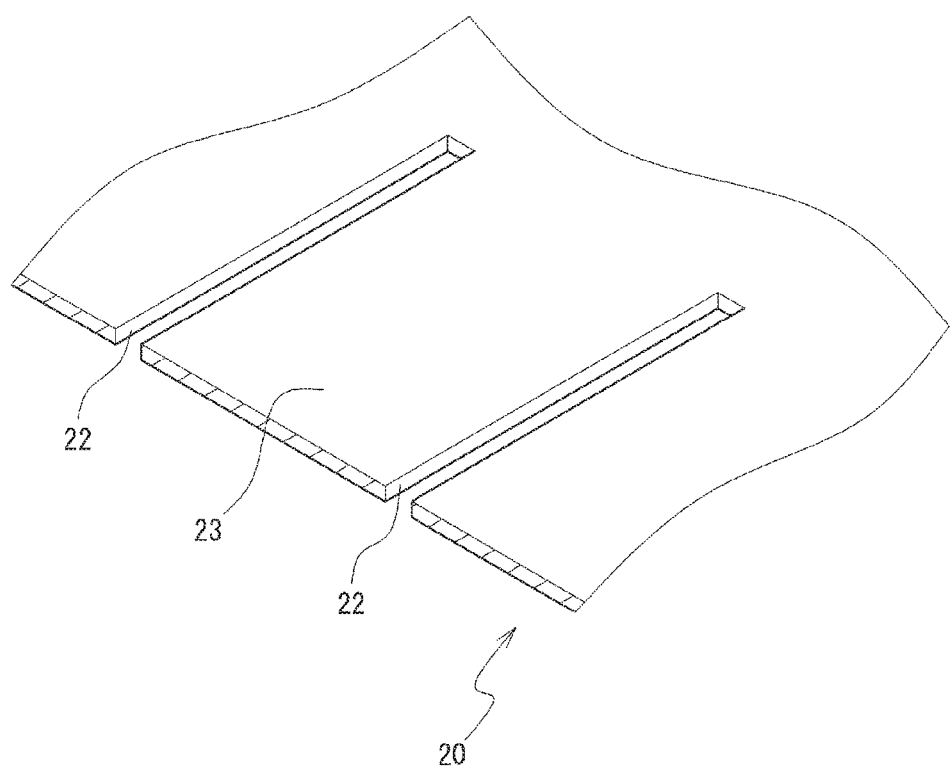
FIG. 6 is a diagram showing an enlarged cantilever-shaped portion of the conductive member.
Figure 7A:
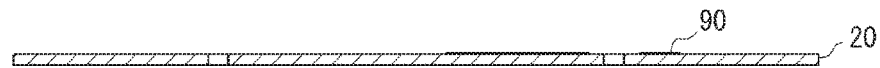
FIG. 7 is a diagram illustrating a first example of the method for manufacturing a circuit assembly according to this embodiment.
Figure 7B:
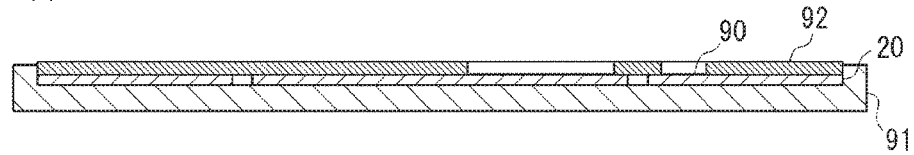
Figure 7C:
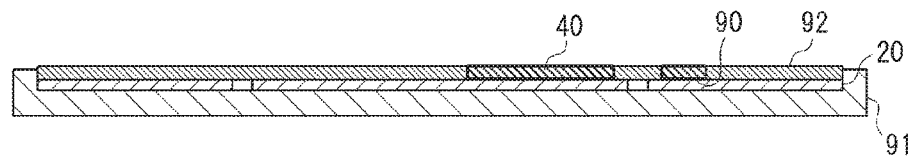
Figure 7D:
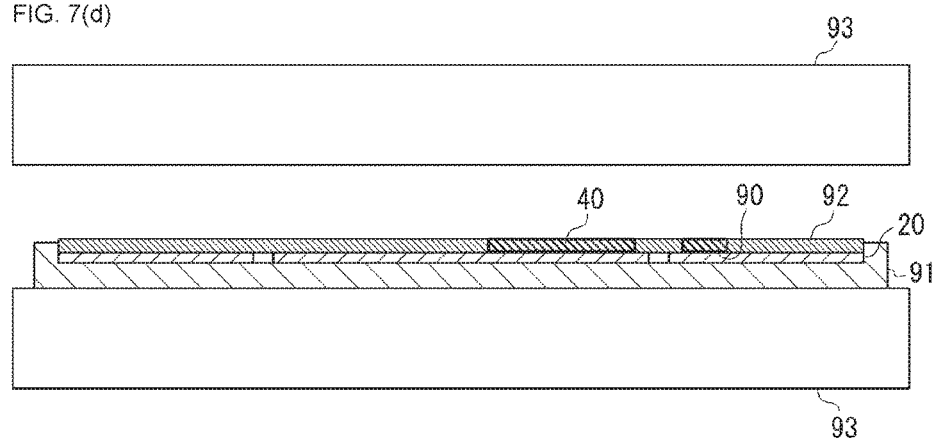
Figure 7E:
Figure 7F:
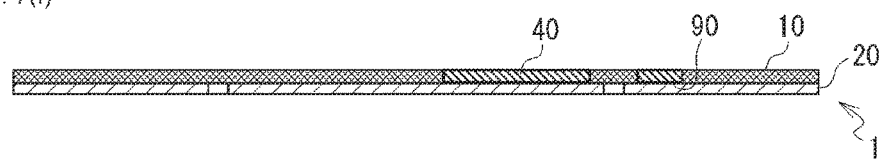
Figure 8A:
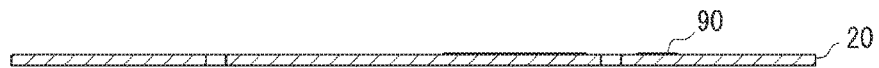
FIG. 8 is a diagram illustrating a second example of the method for manufacturing a circuit assembly according to this embodiment.
Figure 8B:
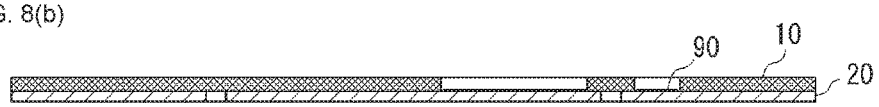
Figure 8C:
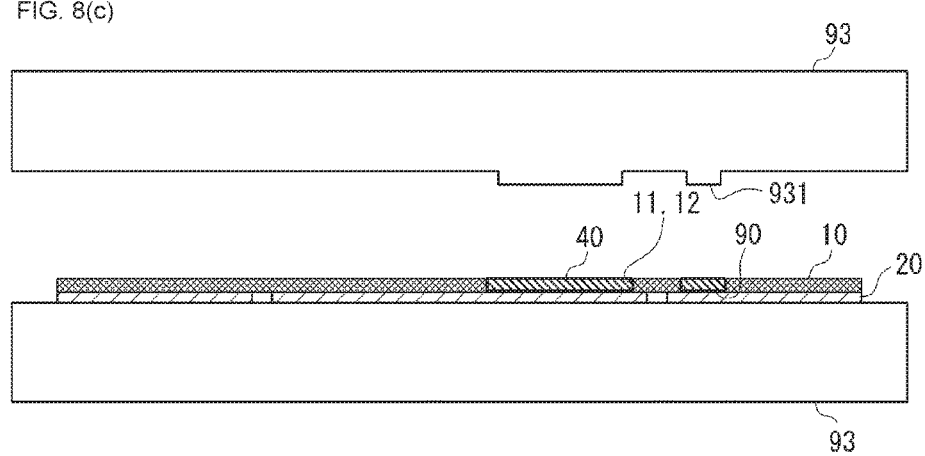
Figure 8D:
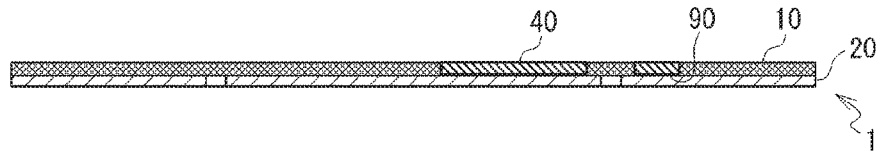

As described later, the tapered portion 611a of the support member 61 enters a slit 22 formed in the conductive member 20. The conductive member 20 constitutes a predetermined conductive path due to the formation of these slits 22. That is, the slits 22 are formed in order to define sites that are not to be shorted. The cantilever-shaped portion 23 (portion that easily undergoes elastic deformation about the base end before the conductive member 20 is fixed to the substrate 10) is constructed in the conductive member 20 by forming these slits 22 (see FIG. 6). In the present embodiment, at least some of the electronic components 30 are arranged on this cantilever-shaped portion 23. The width of each slit 22 is set to be larger than the front end of the tapered portion 611a of the above-described support member 61 and to be smaller than the base end. That is, part on the front ends of the tapered portion 611a of the support members 61 can enter the slits 22.

A biasing member 62 for support (coil spring in the present embodiment) is provided below the flange portion 612 of the support member 61. The support member 61 is biased upward by this biasing member 62 for support.

Positioning pins 73 for positioning the conductive member 20 and a holding plate 80 are fixed to the base member 70. The positioning hole 21 formed in the conductive member 20 is provided in a portion that is to be cut off eventually (when the circuit assembly 1 is completed). Since the conductive member 20 constitutes a predetermined conductive path, the conductive member 20 is not in a state in which all of its portions are connected to each other when the circuit assembly 1 is assembled (because that would short the conductive member 20). A predetermined conductive path is constituted by cutting off at least part of a portion protruding from the substrate 10 after the conductive member 20 is joined to the substrate 10. That is, since all portions of the conductive member 20 in a state before the conductive member 20 is fixed to the substrate 10 are connected to each other, if the positioning hole 21 is formed in the portion that is to be cut off eventually, this positioning hole 21 can be used as the reference for positioning.

Although not shown, also provided is a structure for keeping a relative positional relationship in the surface direction between the base member 70 and the pressing members 51 (holder 52).

The holding plate 80 is provided with the positioning hole 81 into which the positioning pin 73 is insertable and a recessed portion 82 for pressing that the front end of the pressing member 51 can enter. The bottom wall of the recessed portion 82 for pressing is provided with a relay member disposing hole 83 that the relay member 40 can enter. The thickness (length in the vertical direction) of the bottom wall of the recessed portion 82 for pressing is larger than the height of the relay member 40 (length in the vertical direction). Specifically, the thickness of the bottom wall of the recessed portion 82 for pressing is set such that the tapered surface 511a of the pressing member 51 accommodated in the recessed portion 82 for pressing can come into contact with the relay member 40 disposed inside the relay member disposing hole 83.

A method for achieving a state in which the relay members 40 are pressed against the conductive member 20 is as follows. First, the conductive member 20 is placed on the base member 70. The conductive member 20 is positioned with respect to the base member 70 by inserting the positioning pins 73 into the positioning holes 21 formed in the conductive member 20. When the conductive member 20 is positioned with respect to the base member 70, part of the front ends of the tapered portions 611a of the support member 61 enter the slits 22 formed in the conductive member 20.

Next, the holding plate 80 is placed on the conductive member 20. The holding plate 80 is positioned with respect to the base member 70 and the conductive member 20 by inserting the positioning pins 73 into the positioning holes 81 formed in the holding plate 80. Accordingly, the conductive member 20 is sandwiched between the base member 70 and the holding plate 80. The holding plate 80 functions so as to press the conductive member 20 against the base member 70. Thus, the tapered portions 611a of the support member 61 are pressed into the slits 22 due to the effect of the biasing force of the biasing member 62 for support. The cantilever-shaped portion 23 of the conductive member 20 is held between the support members 61 that have been pressed into the slits 22, and the movement of the cantilever-shaped portion 23 in the surface direction is restricted.

Next, the relay members 40 are installed in the relay member disposing holes 83. Accordingly, the relay members 40 are disposed at approximately those positions on the conductive member 20 at which the relay members 40 are to be disposed.

Then, the pressing members 51 (holder 52) are lowered such that the relay members 40 come into contact with the tapered surfaces 511a of the pressing members 51. Since the relative positional relationship in the surface direction between the base member 70 and the pressing members 51 (holder 52) is kept and the conductive member 20 is positioned with respect to the base member 70, the relay members 40 that have been fitted into the recessed portions 511 of the pressing members 51 are guided by the tapered surfaces 511a and move to their fixing positions on the conductive member 20. Then, in a state in which the upper edges of the relay members 40 are in line contact with the tapered surfaces 511a of the pressing members 51, the relay members 40 are pressed against the conductive member 20. One relay member 40 is pressed by one pressing member 51.

In this manner, the relay members 40 are reliably pressed against the conductive member 20 due to the configuration in which the relay members 40 are pressed against the conductive member 20 by the pressing members 51 that are movable in a direction (vertical direction) in which the pressing members 51 independently apply pressure thereto (compared to a structure in which all of the relay members 40 are pressed against the conductive member 20 by one member). That is, it is possible to prevent a situation in which some relay members 40 are not sufficiently pressed against the conductive member 20. Therefore, it is possible to prevent a situation in which some relay members 40 and the conductive member 20 are not sufficiently joined or positions (heights) of the front end surfaces (surfaces to which terminals are connected) of the relay members 40 are not the same.

In particular, in the present embodiment, the pressure with which the relay members 40 are pressed against the conductive member 20 becomes nearly uniform due to the configuration in which the relay members are pressed against the tapered surfaces 511a of the pressing members 51. For example, even if manufacturing errors occur, such as slight warping of the conductive member 20 or slight thickness differences between the relay members 40, the circuit assembly does not have a configuration in which the pressing members 51 and the relay members 40 are in surface contact with each other, and thus it is possible to prevent the pressure with which some relay members 40 are pressed against the conductive member 20 from being too high or too low compared to the pressure with which other relay members 40 are pressed against the conductive member 20. Also, a structure in which the pressing members 51 are biased by the biasing member 50 for pressing, as in the present embodiment, makes it possible to further increase the capability of making the pressure with which the relay members 40 are pressed against the conductive member 20 nearly uniform.

Also, the present embodiment has a structure in which a plurality of pressing members 51 are supported by one holder 52 (a structure may be adopted in which all of the pressing members 51 are supported by one holder 52, or a structure may be adopted in which two or more of all of the pressing members 51 are supported by one holder 52). Such a structure makes it possible to reduce gaps between pressing members 51 supported by the same holder 52. That is, even if the gaps between at least some relay members 40 need to be reduced, it is not very difficult to perform the step of joining the relay members 40 to the conductive member 20.

Also, in the present embodiment, the conductive member 20 has the cantilever-shaped portion 23 and at least some of the relay members 40 are fixed onto the cantilever-shaped portion 23. However, since the movement of the cantilever-shaped portion 23 in the surface direction is restricted by the support members 61, it is possible to prevent relative positions of the conductive member 20 (cantilever-shaped portion 23) and the relay members 40 from shifting due to the movement of the cantilever-shaped portion 23.

Note that the method for fixing the relay members 40 to the conductive member 20 is not limited to a specific method. The relay members 40 may be welded to the conductive member 20 in a state in which the pressing force of the pressing members 51 is applied to the relay members 40 (ultrasonic welding), or the conductive member 20 and the relay members 40 may be joined with a conductive adhesive in a state in which the pressing force of the pressing members 51 is applied to the relay members 40.

Also, a configuration may be adopted in which the biasing members 53 for pressing, which bias the pressing members 51, or the biasing members 62 for support, which bias the support members 61, are not provided. These biasing members are not limited to coil springs as long as a force that biases the pressing members 51 and the support members 61 toward the conductive member 20 is generated when the relay members 40 are pressed against the conductive member 20. The pressing members 51 and the support member 61 may also be biased by packed oil or the like.

Thereafter, the circuit assembly 1 can be obtained by joining the substrate 10 to the obtained assembly of the conductive member 20 and the relay members 40.

FIG. 7 shows a first example of the method for manufacturing the circuit assembly 1. The procedure of this manufacturing method is as follows. First, a joining material (solder or the like) for joining the relay members 40 to the conductive member 20 is applied thereto (first step) (see FIG. 7(a)). Thereafter, the conductive member 20 is set in a receiving jig 91 and a relay member positioning jig 92 is placed on the conductive member 20 (second step) (see FIG. 7(b)). The conductive member 20 is positioned with respect to this receiving jig 91 by the conductive member 20 being fitted into the recessed portion formed in the receiving jig 91. The relay member positioning jig 92 is fittable to the receiving jig 91. That is, relative positions of both jigs are determined in their fitted state. The relay member 40 is installed in a through hole formed in the relay member positioning jig 92 (third step) (see FIG. 7(c)). Accordingly, the relative positions of the conductive member 20 and the relay members 40 are determined. Thereafter, the relay members 40 are pressed against the conductive member 20 by pressing units 93 (fourth step) (see FIG. 7(d)). If the above-described joining material 90 is solder, the pressing units 93 are configured to generate heat for melting solder. Accordingly, the assembly of the conductive member 20 and the relay members 40 can be obtained (see FIG. 7(e)). Thereafter, the substrate 10 is joined to the obtained assembly of the conductive member 20 and the relay members 40 (fifth step) (see FIG. 7(f)). Accordingly, the circuit assembly 1 can be obtained.

FIG. 8 shows a second example of the method for manufacturing the circuit assembly 1. The procedure of this manufacturing method is as follows. First, a joining material (solder or the like) for joining the relay members 40 to the conductive member 20 is applied thereto (first step) (see FIG. 8(a)). Thereafter, the conductive member 20 and the substrate 10 are joined (second step) (see FIG. 8(b)). The relay members 40 are then fitted into the openings (first opening 11 and second opening 12) formed in the substrate 10, and the relay members 40 are pressed against the conductive member 20 by the pressing units 93 (third step) (see FIG. 8(c)). If the above-described joining material 90 is solder, the pressing units 93 are configured to generate heat for melting solder. Also, the upper portion (the substrate 10 side) of the pressing unit 93 may be provided with a protrusion 931 for preventing the upper portion from interfering with the substrate 10. Accordingly, the circuit assembly 1 can be obtained (see FIG. 8(d)).

In this manner, the second example is superior in that it is not necessary to use a positioning jig (the receiving jig 91 or the relay member positioning jig 92) used in the above-described first example. That is, the second example is superior in that the conductive member 20 and the substrate 10 are joined before the relay members 40 are joined to the conductive member 20, and thus the substrate 10 (the first opening 11 and the second opening 12) functions as a member for positioning the relay members 40 with respect to the conductive member 20.

Although embodiments of the present invention were described in detail above, the present invention is not merely limited to the above-described embodiments, and it will be appreciated that various modifications can be made without departing from the gist of the present invention.

For example, the electronic components 30 of the circuit assembly 1 in the above-described embodiment were described to have three types of terminals, and two types thereof (the first terminal 32 and the second terminal 33) are electrically connected to the conductive member 20 via the relay members 40. However, it is sufficient that some of a plurality of types of terminals are connected to the conductive member 20 via the relay members 40. That is, a similar technical idea can also be applied to the case where only one type of terminal is connected to the conductive member 20 via the relay members 40.

Also, the electronic components 30 of the circuit assembly 1 in the above-described embodiment were described in which each electronic component 30 has three types of terminals and some of these terminals are electrically connected to the conductive member 20 via the relay members 40. However, the number of types of terminals is not limited to three, and a configuration may be adopted in which at least one of the terminals of an electronic component having two types of terminal, or four or more types of terminals is electrically connected to the conductive member 20 via the relay members 40.

The invention claimed is:

1. A circuit assembly comprising:
    a substrate having a top surface opposite of a bottom surface, the substrate including an opening and an electronic component having a plurality of terminals, wherein one of the plurality of terminals is disposed on an underside of the electronic component, a portion of the electronic component mounted on the top surface of the substrate and another portion of the underside terminal of the electronic component disposed over the opening;
    a conductive member that is a plate-shaped member fixed to the bottom surface of the substrate, the conductive member constituting a conductive path; and
    a relay member that is fixed to a top surface of the conductive member and made of an electrically conductive material, the relay member disposed entirely within the opening formed in the substrate, wherein the terminal disposed on an underside of the electronic component is electrically connected to the relay member so as to maintain a bottom surface of the electronic component on a plane coplanar with the top surface of the substrate.

2. The circuit assembly according to claim 1, wherein the surface of the relay member that is opposite to the conductive member and the top surface of the substrate on which the electronic component is mounted have approximately the same height.

3. The circuit assembly according to claim 1, wherein the relay member is made of a material different from that of the conductive member.

4. A method for manufacturing the circuit assembly according to claim 1, comprising:
a relay member fixing step of fixing a plurality of the relay members to the conductive member simultaneously,
wherein a pressure applying means for pressing the plurality of relay members against the conductive member is used in the relay member fixing step.

5. The circuit assembly according to claim 2, wherein the relay member is made of a material different from that of the conductive member.

6. A method for manufacturing the circuit assembly according to claim 2, comprising: a relay member fixing step of fixing a plurality of the relay members to the conductive member simultaneously, wherein a pressure applying means for pressing the plurality of relay members against the conductive member is used in the relay member fixing step.

7. The circuit assembly according to claim 3, wherein a difference between linear expansion coefficients of a material constituting the substrate and a material constituting the relay member is smaller than 10 ppm/.degree. C.

8. A method for manufacturing the circuit assembly according to claim 3, comprising: a relay member fixing step of fixing a plurality of the relay members to the conductive member simultaneously, wherein a pressure applying means for pressing the plurality of relay members against the conductive member is used in the relay member fixing step.

9. The method for manufacturing the circuit assembly according to claim 4, wherein the pressure applying means has a plurality of pressing members that respectively come into contact with the plurality of relay members.

10. The method for manufacturing the circuit assembly according to claim 4, wherein if the conductive member includes a cantilever-shaped portion and the relay members are fixed to the cantilever-shaped portion, a support means for supporting the cantilever-shaped portion is used in the relay member fixing step.

11. A method for manufacturing the circuit assembly according to claim 7, comprising: a relay member fixing step of fixing a plurality of the relay members to the conductive member simultaneously, wherein a pressure applying means for pressing the plurality of relay members against the conductive member is used in the relay member fixing step.

12. The method for manufacturing the circuit assembly according to claim 9, wherein the pressing members are each provided with a recessed portion whose opening portion is larger than the corresponding relay member and that has a tapered surface whose inner surface widens toward its front end, and
the relay members are pressed against the conductive member by the tapered surfaces of the pressing members in the relay member fixing step.

13. The method for manufacturing the circuit assembly according to claim 9, wherein if the conductive member includes a cantilever-shaped portion and the relay members are fixed to the cantilever-shaped portion, a support means for supporting the cantilever-shaped portion is used in the relay member fixing step.

14. The method for manufacturing the circuit assembly according to claim 10, wherein if a portion of the conductive member has a cantilever shape due to formation of a slit in the conductive member, the support means has a support member provided with a tapered portion that tapers off toward its front end, and the tapered portion of the support member enters the slit of the conductive member in the relay member fixing step.

15. The method for manufacturing the circuit assembly according claim 12, wherein if the conductive member includes a cantilever-shaped portion and the relay members are fixed to the cantilever-shaped portion, a support means for supporting the cantilever-shaped portion is used in the relay member fixing step.

* * * * *